(12) United States Patent
Tate et al.

(10) Patent No.: US 8,460,026 B2
(45) Date of Patent: Jun. 11, 2013

(54) CIRCUIT ELEMENT COUPLING DEVICES AND METHODS FOR FLEXIBLE AND OTHER CIRCUITS

(75) Inventors: Michael J. Tate, Balsam Lake, WI (US); David G. Sime, Minnetonka, MN (US)

(73) Assignee: Soligic, Inc., North Mankato, MN (US)

( * ) Notice: Subject to any disclaimer, the term of this patent is extended or adjusted under 35 U.S.C. 154(b) by 75 days.

(21) Appl. No.: 13/093,117

(22) Filed: Apr. 25, 2011

(65) Prior Publication Data

US 2012/0270437 A1  Oct. 25, 2012

(51) Int. Cl.
*H01R 13/00* (2006.01)
(52) U.S. Cl.
USPC .................... 439/500; 439/77; 439/55
(58) Field of Classification Search
USPC .............................. 439/500, 77, 55
See application file for complete search history.

(56) References Cited

U.S. PATENT DOCUMENTS

| | | | |
|---|---|---|---|
| 4,487,820 A | 12/1984 | Engelstein et al. | |
| 5,024,605 A * | 6/1991 | Kasatani et al. | 439/500 |
| 5,049,091 A * | 9/1991 | Tanaka | 439/500 |
| 5,197,889 A * | 3/1993 | Rizzo et al. | 439/76.1 |
| 5,427,537 A * | 6/1995 | Savovic et al. | 439/77 |
| 5,505,629 A * | 4/1996 | Majima et al. | 439/78 |
| 5,558,679 A | 9/1996 | Tuttle | |
| 5,575,682 A * | 11/1996 | Alexander | 439/500 |
| 5,763,058 A | 6/1998 | Isen et al. | |
| 5,796,588 A * | 8/1998 | Machida et al. | 361/773 |
| 5,922,489 A | 7/1999 | Adachi | |
| 6,109,530 A | 8/2000 | Larson et al. | |
| 6,293,819 B1 * | 9/2001 | Wu | 439/500 |
| 6,369,793 B1 | 4/2002 | Parker | |
| 6,722,916 B2 | 4/2004 | Buccinna et al. | |
| 6,887,097 B2 * | 5/2005 | Nakagawa | 439/500 |
| 6,911,279 B2 | 6/2005 | Po et al. | |
| 7,371,108 B2 | 5/2008 | Sun | |
| 7,379,296 B1 * | 5/2008 | Huang | 361/679.41 |
| 7,624,499 B2 | 12/2009 | Stole | |
| 2005/0194434 A1 | 9/2005 | Trent, Jr. | |
| 2008/0105751 A1 | 5/2008 | Landau | |
| 2010/0047677 A1 | 2/2010 | Ornt | |
| 2010/0083497 A1 | 4/2010 | Slaton et al. | |

* cited by examiner

*Primary Examiner* — Gary F. Paumen
(74) *Attorney, Agent, or Firm* — Patterson Thuente Pedersen, P.A.

(57) ABSTRACT

Embodiments relate to coupling and/or holding devices for electrically and/or mechanically contacting circuit elements, such as power sources, sensors, transducers and other devices. In one embodiment, a coupling device comprises a substrate having at least one printed conductive element and at least one fold, flap, slit, slot, perforation or other alteration configured to encourage contact between a circuit element, such as a battery, sensor, transducer or other element, and the at least one printed conductive element.

55 Claims, 6 Drawing Sheets

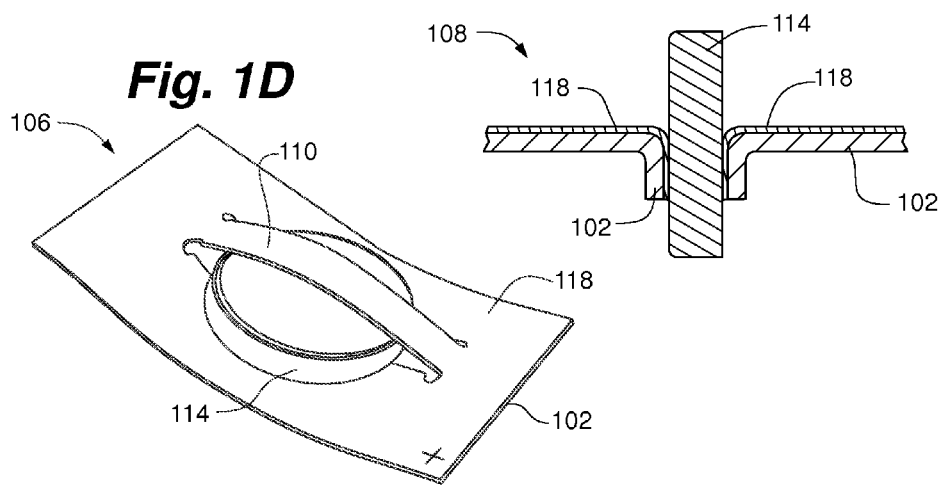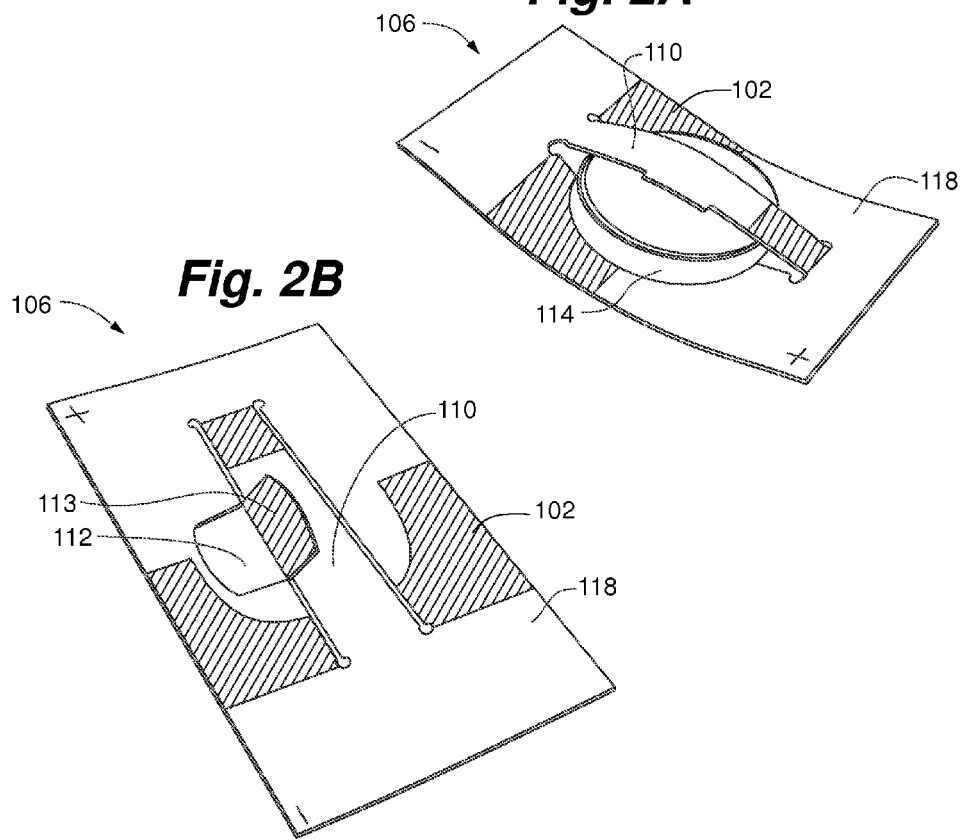

CIRCUIT ELEMENT COUPLING DEVICES AND METHODS FOR FLEXIBLE AND OTHER CIRCUITS

TECHNICAL FIELD

The invention relates generally to circuit elements and more particularly to coupling and/or holding devices for contacting circuit elements, such as power sources, sensors, transducers and other devices.

BACKGROUND

Efforts have been made in recent years to print electrical circuits and circuit elements, including power sources. While some successes have been achieved, the printing of power sources, such as batteries, is still being perfected.

Many applications for printed circuits offer enough design flexibility that conventional batteries, such as button-cell batteries, can be used instead of or until printed batteries are more commercially viable. Additionally, a multitude of applications exist in which the use of conventional batteries is more cost-effective, practical or otherwise preferred.

Therefore, there is a need for devices, systems and methods that make conventional battery types compatible with and coupleable to printed, conventional, or otherwise produced circuit elements on flexible or partially flexible substrates.

SUMMARY

Embodiments relate to coupling and/or holding devices for electrically and/or mechanically contacting circuit elements, such as power sources, sensors, transducers and other devices, and methods related thereto. The coupling and/or holding devices can comprise a substrate that is flexible or rigid, though in embodiments a substrate that is sufficiently flexible to enable partial deformation of the substrate is used. Flexibility of the substrate can be beneficial to the extent that a deformation or deviation from planarity can be made of sufficient amplitude to encompass or embrace the battery or other circuit element to be attached and to support the circuitry on the substrate to be held in contact with the battery or other terminals. Therefore, any requirement for and/or degree of native flexibility of the substrate will differ from application to application.

Embodiments generally incorporate a minimum number of additional steps and/or additional hardware elements when compared with conventional solutions and are contemplated with a view to maintaining the intrinsic mechanical flexibility of the circuit by avoiding the attachment of unnecessary rigid hardware and interconnect elements. Advantages thereby provided by embodiments include enhanced system reliability and flexibility, no additional hardware requirements, and associated cost savings.

In one embodiment, a coupling device comprises a flexible substrate having at least one opening formed therein to receive a battery such that a first terminal of the battery contacts a first portion of a first surface of the substrate and a second terminal of the battery contacts a second portion of the first surface of the substrate; and a first conductive element formed on the first portion of the first surface of the substrate to contact the first terminal of the battery, and a second conductive element formed on the second portion of the first surface of the substrate to contact the second terminal of the battery.

In another embodiment, a method of forming a coupling device comprises forming circuitry on a first surface of a flexible substrate, the circuitry comprising first and second electrically conductive contacts; forming at least one cut in the flexible substrate; and inserting a battery into the at least one cut such that a first terminal of the battery is in communication with the first electrically conductive contact and a second terminal of the battery is in communication with the second electrically conductive contact.

In another embodiment, a circuit comprises a plurality of coupling devices configured to be coupled together, at least one of the plurality comprising a flexible substrate having at least one opening formed therein to receive a circuit element such that a first terminal of the circuit element contacts a first portion of a first surface of the substrate and a second terminal of the circuit element contacts a second portion of the first surface of the substrate, and a first conductive element formed on the first portion of the first surface of the substrate to contact the first terminal of the first circuit element, and a second conductive element formed on the second portion of the first surface of the substrate to contact the second terminal of the battery.

In another embodiment, a coupling device comprises a flexible substrate having at least one opening formed therein to receive a circuit element such that a first terminal of the circuit element contacts a first portion of the substrate and a second terminal of the circuit element contacts a second portion of the substrate; and a first conductive element formed on the first portion of the substrate to contact the first terminal of the circuit element, and a second conductive element formed on the second portion of the substrate to contact the second terminal of the circuit element.

The above summary of the invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 2A depicts a coupling device according to an embodiment.

FIG. 2B depicts a coupling device according to an embodiment.

FIG. 1D depicts a coupling device having a coin cell battery where both sides of the substrate are conductive according to an embodiment.

FIG. 1E depicts a cross-section of the coupling device of FIG. 1C taken at line A-A.

Figure 1A:
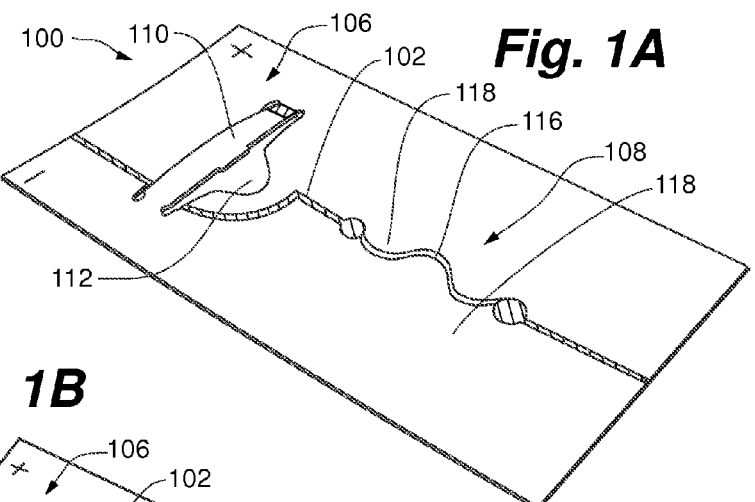
FIG. 1A depicts a coupling device according to an embodiment.

While the invention is amenable to various modifications and alternative forms, specifics thereof have been shown by way of example in the drawings and will be described in detail. It should be understood, however, that the intention is not to limit the invention to the particular embodiments described but rather to include all modifications, equivalents, and alternatives.

DETAILED DESCRIPTION

Embodiments relate to coupling and/or holding devices for electrically and/or mechanically contacting circuit elements, such as power sources, sensors, transducers and other devices. In one embodiment, a coupling device comprises a substrate, such as a sufficiently flexible substrate, having at least one printed or otherwise formed conductive element and at least one fold, flap, slit, slot, perforation or other alteration configured to encourage and maintain contact between a circuit element, such as a battery, sensor, transducer or other element, and the at least one printed, or otherwise formed, conductive element.

Referring to FIG. 1A, an embodiment of a coupling device 100 is depicted. Coupling device 100 comprises a substrate 102. In embodiments, substrate 102 can comprise paper, plastic, plastic film, metal, glass, composite, polymer, polymer film, foil, fabric, a woven material or a combination or composite thereof, and can be coated, printed, embossed and/or otherwise treated. Substrate 102 is non-conductive in embodiments and can be rigid or flexible, though in some embodiments is sufficiently flexible to enable at least partial deformation thereof as discussed elsewhere herein; stand-alone, integrated, encapsulated or otherwise combined with some other structure; coated with an adhesive or other material; and of various dimensions, including length, width and height. The particular configuration of substrate 102 can vary widely in embodiments according to an application of device 100, required specification, or other characteristics as appreciated by those skilled in the art. For example, the embodiment of device 100 depicted in FIG. 1A comprises two individual coupling devices 106 and 108 on a single substrate 102, while other embodiments can comprise more or fewer devices, such as the embodiment of single coupling device 106 depicted in FIG. 2A. Additionally, in embodiments comprising a plurality of devices, the devices can be identical or different and can serve the same ear different purposes. For example, the intended function of both devices 106 and 108 is to physically and electrically couple a coin cell battery to a circuit or conductive elements or traces on substrate 102. In other embodiments, one device can be similarly configured, while another device on the same substrate is configured to physically and/or electrically couple that substrate with another substrate or device, such as a zero insertion force (ZIF) connector, a separate packaged element or some other device or structure. Further, devices 106 and 108 can be electrically coupled, in series or parallel, or can be stand-alone. These are but examples and are not limiting with respect to the myriad embodiments that are possible.

Figure 3:
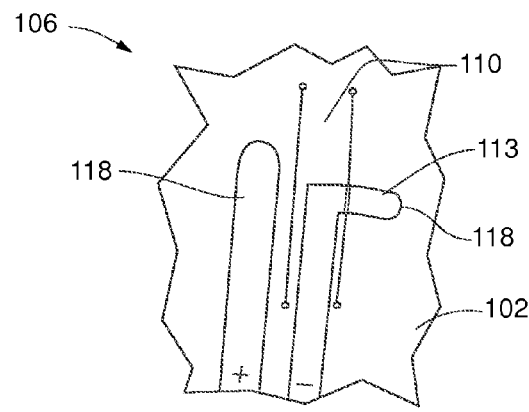
FIG. 3 depicts a coupling device according to an embodiment.

As mentioned, device 100 comprises two individual coupling devices 106 and 108. Coupling device 106 comprises a coupling portion 110 formed by drilling, cutting, slicing, stamping, tooling or otherwise deforming the original substrate 102 such that coupling portion 110 can be partially separated from substrate 102 to form an aperture or opening to receive a battery or other element. In various embodiments, the coupling portions, such as 110 and others discussed herein, can be designed or tailored to couple a particular device or circuit element and/or can be designed or tailored to hold the device or element in a mechanically stable manner. For example, a series of incrementally shorter slots can be used to hold a battery more securely in a resulting wedge-shaped entrapment area. In the embodiment of FIG. 1A, an aperture 112 is also formed in substrate 102 adjacent coupling portion 110 by including a small flap 113 (see FIG. 2B) with coupling portion 110. Flap 113, when folded under 180 degrees, enables printing, embossing, coating or some other suitable form of application of both positive and negative electrical contacts on the same surface of substrate 102, as depicted in FIG. 3. In other embodiments, electrical contacts and/or electrical circuitry can be formed on both surfaces of substrate 102. In embodiments, the electrical contacts are formed of a conductive ink, such as one comprising silver, carbon, copper, aluminum, or some other suitable material. In other embodiments, some other electrically conductive material or composition is used. The size, shape and position of flap 113 relative to the remainder of coupling portion 110 can also vary in embodiments. In general, however, embodiments comprise modifications rather than additions to substrate 102, providing advantages over conventional and alternate solutions.

Figure 1B:
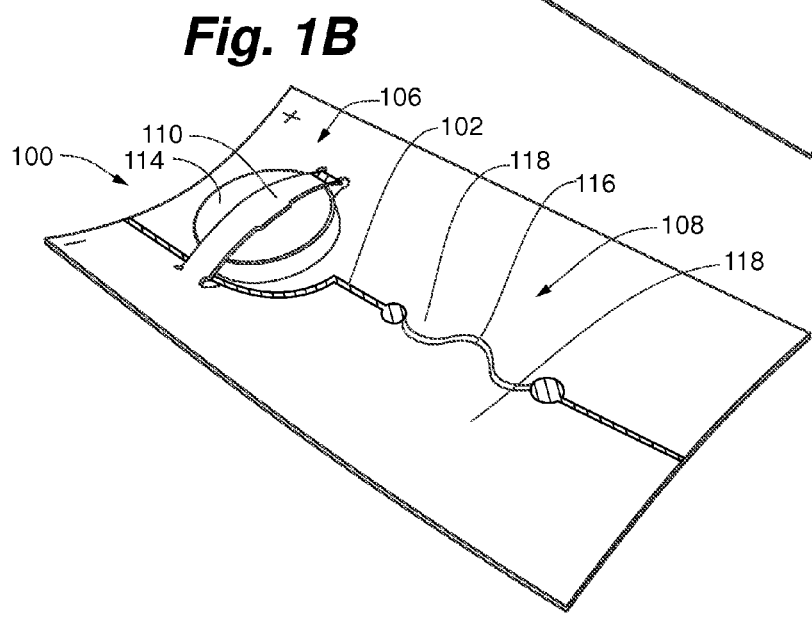
FIG. 1B depicts a coupling device according to an embodiment.
Figure 1C:
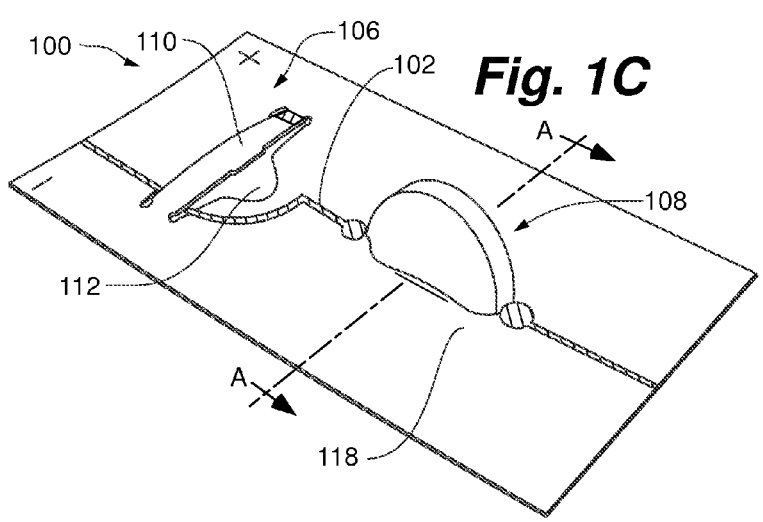
FIG. 1C depicts the coupling device of FIG. 1A having a coin cell battery disposed within the slit according to an embodiment.

Referring also to FIGS. 1B and 2A, the configuration of coupling portion 110, which can vary in embodiments in length, width, orientation or in some other manner, enables a coin cell battery 114 to be inserted and retained between coupling portion 110 and the remainder of substrate 102. Electrical contact is made via the printed portions, as previously discussed. The particular placement, size and configuration of the printed electrical contacts can vary in embodiments. In other embodiments, circuitry can be printed or otherwise incorporated on battery 114, such that the circuitry is coupled to other elements on substrate 102 and/or other coupling devices or circuitry not formed on substrate 102. In embodiments, a mechanical and/or electrically conductive adhesive can also be used to maintain contact between battery 114 (or some other device) and coupling portion 110 and/or substrate 102.

Coupling device 108 comprises a slit or cut 116 in substrate 102. Cut 116 can be formed as discussed above or in some other manner. For example, cut 116, can be formed by first drilling substrate 102 and then slicing, stamping, tooling or otherwise cutting from or between drill points, a method by which stresses on substrate 102 can be reduced. Cut 116 can also be formed by in a tool specifically made for a particular embodiment and/or application. In general, these and other methods of forming the cuts, slits, slots, flaps, folds and other features of embodiments are generally applicable to the various embodiments discussed herein, without limitation.

In the embodiment depicted in FIGS. 1A, 1B, 1C, and 1E cut 116 is curved or otherwise non-linear to facilitate more secure coupling of a battery or other device to substrate 102. Like coupling device 106, coupling device 108 also enables electrical contacts 118 to be printed on the same surface of substrate 102 while still enabling contact with, in one embodiment, both sides of a coin-cell battery, as depicted in FIG. 1E. In other embodiments, coupling device 108 can be configured to receive some other form of battery, circuit element or other coupling device. Therefore, the particular size, orientation, configuration and placement of cut 116 can vary in embodiments. Further, embodiments are also contemplated in which electrical contacts 118 and/or other circuitries are arranged on both major surfaces of substrate 102. For example, as is depicted in FIG. 1D, one terminal of a battery or other circuit element can have a contact 118 on a first surface of substrate 102, while the other terminal has a contact 118 on a second surface of substrate 102. Electrical vias can be included or omitted in this embodiment, or any of the embodiments.

Figure 4:
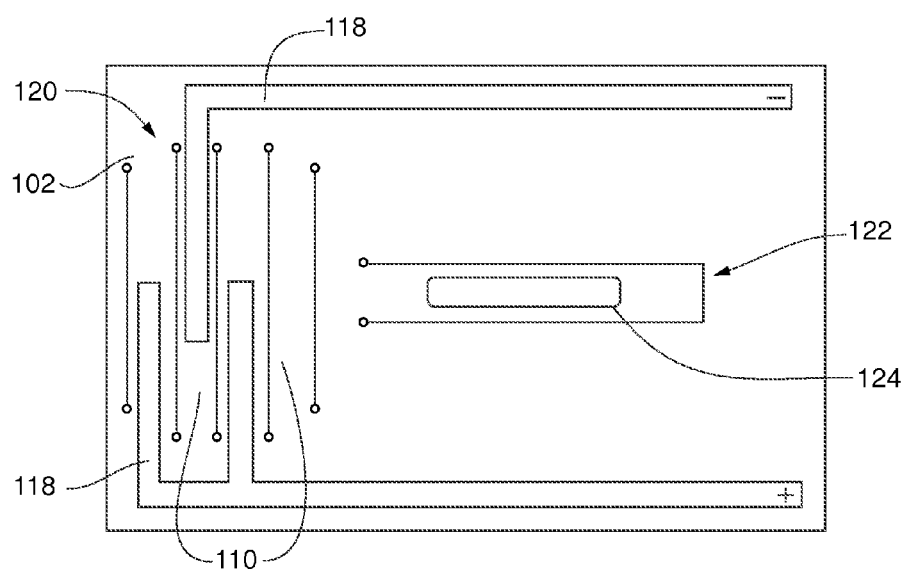
FIG. 4 depicts a coupling device according to an embodiment.

FIG. 4 depicts another embodiment of a coupling device 120. Coupling device 120 is somewhat similar to coupling device 106 but comprises a plurality of coupling portions 110 formed by slicing or cutting substrate 102. The configuration of the plurality of coupling portions 110 again enables electrical contact to be made with both sides of battery when inserted, by electrical contacts 118 printed or otherwise formed on a single surface of substrate 102. A second coupling device 122 is also depicted and is similar to coupling device 108 but formed of a single aperture 124 configured for receiving a battery or other device in substrate 102. Aperture 124, when compared with slit 116, comprises a more slot-like configuration. Such a slot can be sized to receive a particular type of battery or other circuit element. In embodiments, a slot-type configuration can aid in insertion of the battery or other element and reduce stresses on the substrate.

Figure 5:
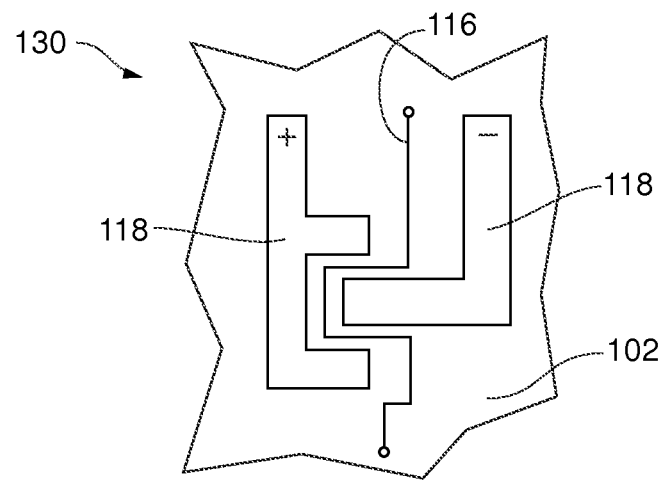
FIG. 5 depicts a coupling device according to an embodiment.

FIG. 5 depicts another embodiment of a coupling device 130. Device 130 is somewhat similar to device 108 in that a coin-cell battery or other device is coupled perpendicularly to the major surfaces of substrate 102. The coupling is perpendicular such that the battery or other device being coupled is oriented such that its terminals are perpendicular to and aligned on an axis parallel to the rest position of the principal surface of the substrate. Device 130 thus also comprises a cut or slit 116 enabling a battery or other device to be inserted and make electrical contact with contacts 118. As in other embodiments, contacts 118 are printed or formed on the same surface of substrate 102, making the manufacturing of device 130 and other embodiments more efficient. The particular layout of contacts 118 and cut 116 can vary in embodiments. One variation according to an embodiment can have the conductive traces on different surfaces of the substrate.

Figure 6:
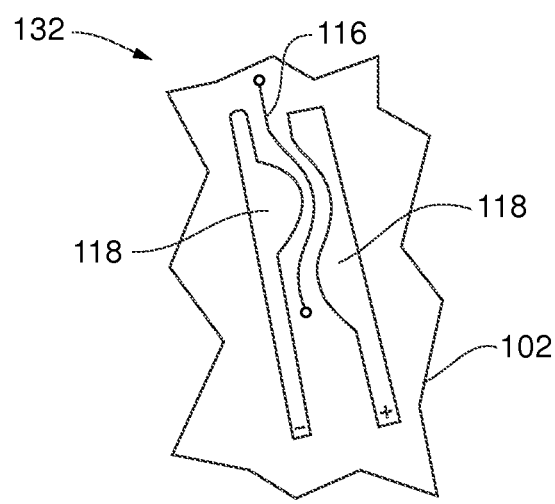
FIG. 6 depicts a coupling device according to an embodiment.
Figure 7:
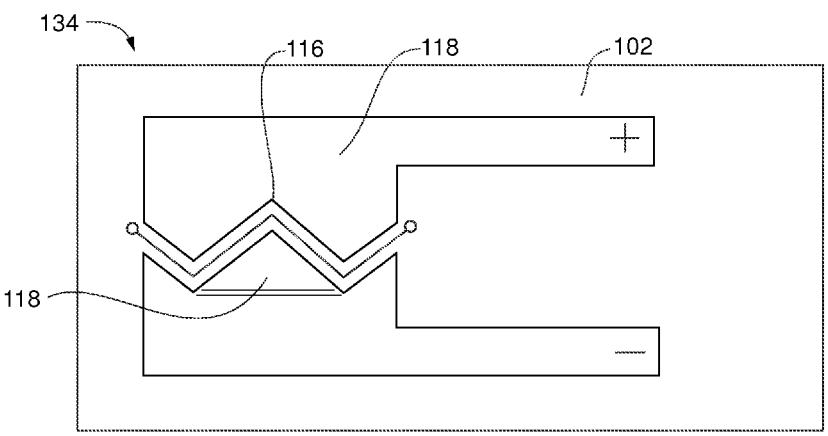
FIG. 7 depicts a coupling device according to an embodiment.

For example, in FIG. 6 another coupling device 132 is depicted, which is somewhat similar to both devices 130 and 108. Device 132 comprises a curved cut 116 and a different configuration of contacts 118 when compared with device 130. In FIG. 7, coupling device 134 comprises a zig-zagged cut 116. As previously discussed, one or another embodiment of the coupling devices can be preferred, desired or required according to a particular application for that coupling device, where the application can impose restrictions on shape, size, layout and orientation.

Figure 8:
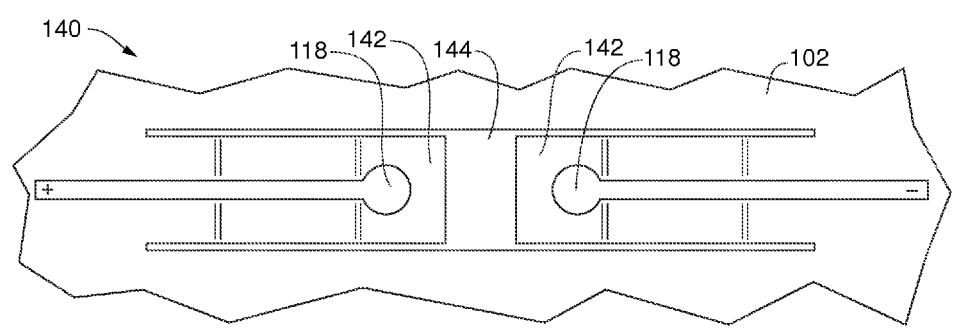
FIG. 8 depicts a coupling device according to an embodiment.

In FIG. 8, coupling device 140 is configured for cylindrical battery, such as an AA, AAA, C- or D-cell battery. Device 140 comprises two flaps 142 formed by cutting substrate 102. Each flap 142 is configured to be folded such that contacts 118 printed on one surface of substrate 102 can be positioned in an opposing fashion to make physical and electrical contact with contacts on each end of a cylindrical battery. Depending upon the composition of substrate 102, flaps 142 can also be stiff enough to secure the battery in the remaining opening 144, which can optionally include a closure mechanism itself formed in a similar manner, by modifying the existing substrate 102. A closure or fastening mechanism can be incorporated in other embodiments as well. In various embodiments, other structure can be used to secure the battery. A modified version of device 140 can also be formed to be compatible with coin-cell and other battery configurations by altering the configuration of flaps 142.

In this and other embodiments, the substrate can comprise a fabric or other woven or non-woven material and can be, for example, integrated with or part of a garment or other item. The contacting circuitry can be formed by printing conductive inks, dispensing conductive substances, applying conductive foils or traces, and/or stitching or weaving conductive threads, yarns and/or filaments. The circuitry remains attached to or supported by the substrate sufficiently to be brought to into contact with appropriate terminals of the battery or other device to be attached.

Figure 9:
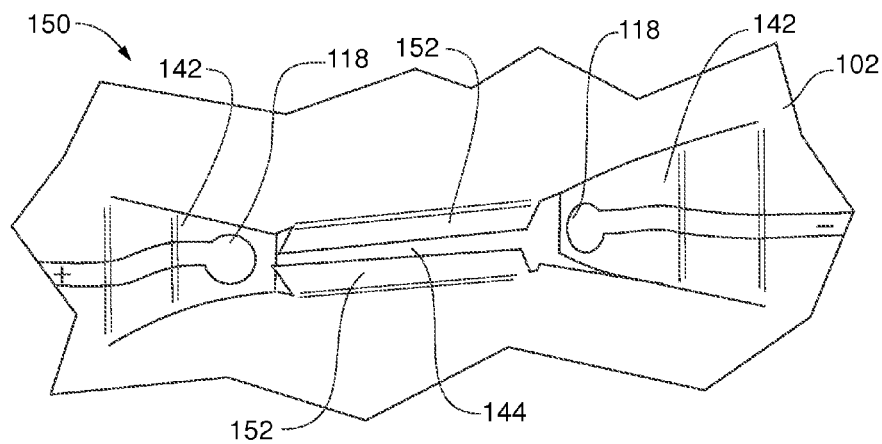
FIG. 9 depicts a coupling device according to an embodiment.

Another embodiment compatible with cylindrical batteries is depicted in FIG. 9. Coupling device 150 of FIG. 9 also comprises flaps 142 of a different configuration than those depicted in FIG. 8. Device 150 also comprises side flaps 152 formed generally perpendicularly to flaps 142 and configured to aid in securing the battery in opening 144. The configurations of flaps 142 and side flaps 152 are but examples, and other configurations can be used in other embodiments, such as by altering the size, shape, orientation or some other physical characteristic of one or more of the flaps 142 and 152. For example, flaps 142 are depicted in FIGS. 8 and 9 as being of the same general size and shape. In other embodiments, one can be larger, smaller or of some different shape when compared with the other. Side flaps 152 can also optionally be coated with an adhesive, friction coating or other material to aid in positioning and securing the battery.

Figure 10:
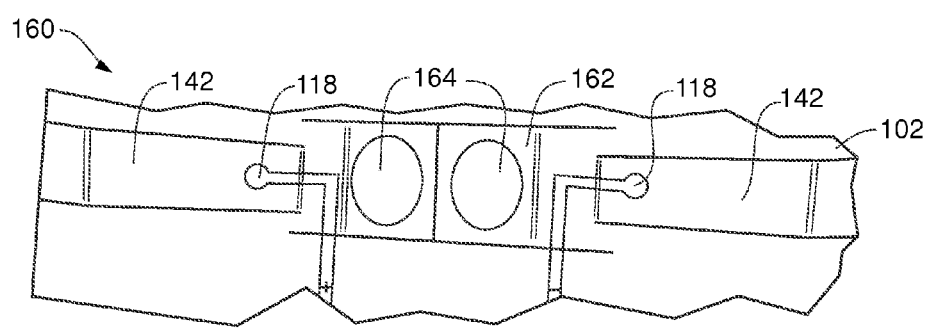
FIG. 10 depicts a coupling device according to an embodiment.

Yet another embodiment of a coupling device 160 suitable for a cylindrical battery is depicted in FIG. 10. Coupling device 160 comprises flaps 142, similar to the embodiments of FIGS. 8 and 9, as well as an intermediary coupling portion 162 comprising a plurality of apertures 164. Apertures 164 are sized and shaped to receive a cylindrical battery and aid in coupling the battery to device 160. Apertures 164 hold the battery between flaps 142, each having a contact 118. The size and shape of apertures 164 can be customized for a particular battery type or other device to be coupled.

Myriad other embodiments consistent with those explicitly depicted herein are also contemplated. Further, various aspects of one or more embodiments can be utilized in or combined with those of other embodiments, as understood by those skilled in the art. As mentioned herein above, the particular design and configuration of any embodiment can be application-driven and/or application-specific. Example applications include medical devices, such as patches or bandages with or without an adhesive surface comprising circuits or circuitry for monitoring temperature, vital signs or some other patient condition and for therapeutic and or diagnostic purposes; packaging and smart labels, such as for food security, freshness, advertising and/or novelty; battery-assisted radio frequency identification (RFID); coupons, cards, cups and other novelties, including those producing light or sound; power arrays; logistics; displays; military; automotive, sensors, such as temperature, chemical, gas and pressure; clothing, garments, and other stitched or sewn items, including vests, belts, packs, necklaces, bracelets, headbands, bags, shirts, pants, bands, hats, infant apparel and accessories and the like for monitoring vital signs or medical conditions, for novelty purposes and for some other use; drug testing, use and compliance; domestic applications, including air fresheners, night lights, air quality and condition monitors and other applications, among others. Other embodiments can involve the use of such a device in sensing applications, such as related to the physical conditions or presence of chemicals in an environment or object. Still other embodiments can comprise and/or be combined with micro-energy or energy-harvesting devices. For example, a rechargeable battery can be coupled to a coupling device comprising a polyvinylidene fluoride (PVDF) film that has a flag or other element that moves in wind or water such that energy can be harvested. Other energy harvesting applications, such as friction, centrifugal force, piezoelectric and more can also be implemented in embodiments. Any of the aforementioned embodiments can comprise an adhesive or other fixing means, such as a hook-and-loop fastener, tape, snaps, buttons, flaps, loops, rivets and the like, for coupling the coupling device to a person, object, device or surface.

Another advantage of embodiments is presented by the manufacturing of coupling devices as discussed herein. In some embodiments, a plurality of coupling devices are printed and formed using a web substrate, such as in high-speed roll-to-roll printing and processing. In other embodiments, sheet-type substrates are used. In either web- or sheet-based implementations, in embodiments the web or sheet is printed with circuitry or circuit elements; then, the web or sheet is run through a die cutting device to create any slits, slots and/or cuts in the printed substrate; next, the battery, batteries or other device(s) to be coupled are inserted, for example using an inserting device such as a LABELAIRE; finally, a web can be rolled or sheeted and/or the web or sheet can be singulated to obtain the individual devices. Devices can also be formed individually in embodiments and/or integral with other items to be built, such as medical patches and the like. Singulated coupling devices can also be coated, enclosed, encapsulated, implanted or otherwise integrated with other systems or devices. The flexibility, adaptability and ability to customize therefore present advantages over conventional solutions.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, locations, configurations etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

What is claimed is:

1. A coupling device comprising:
   a flexible substrate having at least one opening formed therein to receive a battery such that a first terminal of the battery contacts a first portion of a first surface of the substrate and a second terminal of the battery contacts a second portion of the first surface of the substrate; and
   a first conductive element formed on the first portion of the first surface of the substrate to contact the first terminal of the battery, and a second conductive element formed on the second portion of the first surface of the substrate to contact the second terminal of the battery.

2. The coupling device of claim 1, wherein the first and second conductive elements comprise printed conductive elements.

3. The coupling device of claim 1, wherein at least one opening comprises a slit.

4. The coupling device of claim 3, wherein the slit is formed by die-cutting the substrate.

5. The coupling device of claim 1, wherein the at least one opening comprises a slot.

6. The coupling device of claim 4, wherein at least one of hard tooling or soft tooling is used in the die-cutting.

7. The coupling device of claim 3, wherein the slit is one of linear, curved or zig-zagged.

8. The coupling device of claim 3, wherein the battery is inserted into the slit perpendicularly with respect to the first surface of the substrate.

9. The coupling device apt claim 8, wherein the battery comprises a coin-cell battery.

10. The coupling device of claim 1, wherein the substrate comprises a plurality of openings forming at least one coupling strip, and wherein the battery is inserted between the at least one coupling strip and the first surface of the substrate.

11. The coupling device of claim 10, wherein the substrate has a second surface and the battery is positioned between the first surface and a portion of the second surface on the at least one coupling strip when inserted between the at least one coupling strip and the first surface, and wherein the at least one coupling strip comprises at least one flap extending along at least a partial length of the coupling strip and configured to fold about 180 degrees such that a portion of the second surface on the at least one flap opposes the portion of the second surface on the at least one coupling strip.

12. The coupling device of claim 1, wherein the first portion comprises a first flap, and the second portion comprises a second flap.

13. The coupling device of claim 12, wherein the first and second flaps are formed by folding the substrate.

14. The coupling device of claim 13, wherein the first and second flaps are configured to be folded to form an aperture therebetween to receive the battery.

15. The coupling device of claim 14, wherein the first and second flaps maintain contact with the battery via an adhesive.

16. The coupling device of claim 15, wherein the adhesive is at least one of to mechanical adhesive or an electrically conductive adhesive.

17. The coupling device of claim 14, wherein the battery comprises a cylindrical battery.

18. The coupling device of claim 12, further comprising a third flap and a fourth flap formed opposing each other and between the first and second flaps, rotated at about 90 degrees with respect to the first and second flaps.

19. The coupling device of claim 12, further comprising a plurality of apertures formed between the first and second flaps, the plurality of apertures configured to receive the battery.

20. The coupling device of claim 1, wherein the substrate has a plurality of openings formed therein, each of the plurality of openings formed therein to receive as battery.

21. The coupling device of claim 1, wherein the substrate comprises at least one of paper, plastic, plastic film, metal, glass, polymer, polymer film, fabric, foil, a woven material or a combination or composite thereof.

22. The coupling device of claim 21, wherein the substrate includes an adhesive.

23. The coupling device of claim 1, wherein at least one of the first and second conductive elements comprises at least one of a stitched, woven or applied conductive thread.

24. The coupling device of claim 1, wherein at least one of the first and second conductive elements comprises a conductive ink.

25. The coupling device of claim 1, wherein at least one of the first and second conductive elements comprises at least one of silver, copper, aluminum, carbon, an organic conductive polymer, an inorganic conductive polymer or a combination thereof.

26. The coupling device of claim 1, further comprising circuitry formed on the substrate and coupled to the battery by the first and second conductive elements.

27. The coupling device of claim 26, wherein the circuitry is formed by printing.

28. The coupling device of claim 26, wherein the circuitry is formed on at least one of the first surface or a second surface of the substrate.

29. The coupling device of claim 1, wherein the substrate is non-conductive.

30. The coupling device of claim 1, further comprising a closure device configured to secure the battery when received by the at least one opening.

31. The coupling device of claim 1, wherein the battery comprises circuitry printed thereon.

32. A method of forming to coupling device comprising: forming circuitry on a first surface of a flexible substrate, the circuitry comprising first and second electrically conductive contacts; forming at least one cut in the flexible substrate; and inserting a battery into the at least one cut such that a first terminal of the battery is in communication with the first electrically conductive contact and a second terminal of the battery is in communication with the second electrically conductive contact.

33. The method of claim 32, wherein the flexible substrate is formed from a web.

34. The method of claim 33, further comprising rolling the web after the inserting.

35. The method of claim 33, further comprising singulating individual coupling devices from the web.

36. The method of claim 32, wherein the flexible substrate is formed from a sheet.

37. The method of claim 36, further comprising singulating individual coupling devices from the sheet.

38. The method of claim 32, wherein the battery is one of a coin-cell battery or a cylindrical battery.

39. The method of claim 32, further comprising integrating the coupling device in a device.

40. The method of claim 39, wherein the device is selected from the group consisting of a patch, a label, a garment, a tag, a sensor, a sign, a card, a bandage, a sensor and an energy harvester.

41. The method of claim 32, wherein forming further comprises die-cutting the flexible substrate to form the at least one cut.

42. The method of claim 32, wherein forming at least one cut further comprises forming at least one flap.

43. The method of claim 32, further comprising securing the battery relative to the flexible substrate.

44. The method of claim 32, wherein forming the circuitry comprises printing at least a portion of the circuitry.

45. The method of claim 32, further comprising applying an adhesive to the substrate.

46. A circuit comprising: a plurality of coupling devices configured to be coupled together, at least one of the plurality comprising a flexible substrate having at least one opening formed therein to receive a circuit element such that a first terminal of the circuit element contacts a first portion of a first surface of the substrate and a second terminal of the circuit element contacts a second portion of the first surface of the substrate, and a first conductive element formed on the first portion of the first surface of the substrate to contact the first terminal of the first circuit element, and a second conductive element formed on the second portion of the first surface of the substrate to contact the second terminal of the battery.

47. The circuit of claim 46 wherein at least two of the plurality of coupling devices are coupled together in series.

48. The circuit of claim 46, wherein at least two of the plurality of coupling device are coupled together in parallel.

49. The circuit of claim 46, wherein the first circuit element is one of the plurality of coupling devices.

50. The circuit of claim 46, wherein the first circuit element is a battery.

51. The circuit of claim 46, wherein at least one of the plurality of coupling devices comprises an adhesive.

52. A coupling device comprising: a flexible substrate having at least one opening formed therein to receive a circuit element such that as first terminal of the circa element contacts a first portion of the substrate and a second terminal of the circuit element contacts a second portion of the substrate; and a first conductive element formed on the first portion of the substrate to contact the first terminal of the circuit element, and a second conductive element formed on the second portion of the substrate to contact the second terminal of the circuit element.

53. The coupling device of claim 52, wherein the first and second portions are formed on a first surface of the substrate.

54. The coupling device of claim 53, wherein one of the first or second portions is formed on a first surface of the substrate and the other of the first or second portions is formed on a second surface of the substrate.

55. The coupling device of claim 52, wherein the substrate includes an adhesive material.

* * * * *